United States Patent
Nishino et al.

(10) Patent No.: US 9,653,317 B2
(45) Date of Patent: May 16, 2017

(54) PLASMA PROCESSING METHOD AND PLASMA PROCESSING APPARATUS

(71) Applicant: Tokyo Electron Limited, Tokyo (JP)

(72) Inventors: Masaru Nishino, Miyagi (JP); Takao Funakubo, Miyagi (JP); Shinichi Kozuka, Miyagi (JP); Ryosuke Niitsuma, Miyagi (JP); Tsutomu Ito, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/521,737

(22) Filed: Oct. 23, 2014

(65) Prior Publication Data
US 2015/0118859 A1 Apr. 30, 2015

(30) Foreign Application Priority Data

Oct. 24, 2013 (JP) .................................. 2013-221468
Aug. 12, 2014 (JP) .................................. 2014-164369

(51) Int. Cl.
| | | |
|---|---|---|
| *H01L 21/311* | (2006.01) | |
| *H01L 21/3065* | (2006.01) | |
| *H01J 37/32* | (2006.01) | |
| *C23C 16/44* | (2006.01) | |

(52) U.S. Cl.
CPC .... *H01L 21/31116* (2013.01); *C23C 16/4405* (2013.01); *H01J 37/32477* (2013.01); *H01J 37/32862* (2013.01); *H01L 21/3065* (2013.01)

(58) Field of Classification Search
None
See application file for complete search history.

(56) References Cited

U.S. PATENT DOCUMENTS

| | | | | |
|---|---|---|---|---|
| 4,297,162 A | * | 10/1981 | Mundt et al. ................. | 438/729 |
| 5,176,792 A | * | 1/1993 | Fullowan et al. ............ | 438/572 |
| 6,379,575 B1 | * | 4/2002 | Yin ....................... | B08B 7/0035 134/1.1 |
| 6,659,111 B1 | * | 12/2003 | Mouri .................. | C23C 16/4405 134/11 |
| 6,869,542 B2 | * | 3/2005 | Desphande ......... | H01L 21/0276 216/51 |

(Continued)

FOREIGN PATENT DOCUMENTS

| | | |
|---|---|---|
| CN | 1891858 A | 1/2007 |
| JP | 2006-165246 A | 6/2006 |
| JP | 2006-179834 A | 7/2006 |

OTHER PUBLICATIONS

N. Layadi et al., "An Introduction to Plasma Etching for VLSI Circuit Technology", Bell Las Technical Journal, Jul.-Sep. 1999, pp. 155-171.*

*Primary Examiner* — Jiong-Ping Lu
(74) *Attorney, Agent, or Firm* — Brundidge & Stanger, P.C.

(57) ABSTRACT

A metal-containing deposit can be efficiently removed. A plasma processing method includes removing a deposit, which adheres to a member within a processing vessel and contains at least one of a transition metal and a base metal, by plasma of a processing gas containing a CxFy gas, in which x is an integer equal to or less than 2 and y is an integer equal to or less than 6, and without containing a chlorine-based gas and a nitrogen-based gas.

5 Claims, 12 Drawing Sheets

(56) References Cited

U.S. PATENT DOCUMENTS

2006/0118520 A1* 6/2006 Morikita et al. ................ 216/67
2006/0254613 A1   11/2006 Wu et al.
2011/0048453 A1*  3/2011 Honda ................ C23C 16/4405
                                                      134/1.1
2013/0048606 A1    2/2013 Mao et al.

* cited by examiner

FIG. 6

| Material | Ref. | CF4/CO 300/300 DC0V | CF4/CO/Ar 300/300/300 DC0V | CF4/CO/Ar DC-500V |
|---|---|---|---|---|
| Ti | Contamination [×10$^{10}$atms/cm$^2$] 210,000 | Contamination [×10$^{10}$atms/cm$^2$] 18 | Contamination [×10$^{10}$atms/cm$^2$] 52 | Contamination [×10$^{10}$atms/cm$^2$] 340 |
| Hf | Contamination [×10$^{10}$atms/cm$^2$] 170,000 | Contamination [×10$^{10}$atms/cm$^2$] 67 | Contamination [×10$^{10}$atms/cm$^2$] 52 | Contamination [×10$^{10}$atms/cm$^2$] 76 |

FIG. 7

| Material | Ref. | Fluorine gas | Corrosive gases | | | | |
|---|---|---|---|---|---|---|---|
| | | NF3 120sccm | BCl3 200sccm | Cl2 200sccm | BCl3 / Ar 125 / 75sccm | BCl3 / Cl2 125 / 75sccm | Cl2 / NF3 150 / 50sccm |
| Ti | Contamination [×10¹⁰ atms/cm²] 210,000 — 211 | Contamination [×10¹⁰ atms/cm²] 120 — 312 | Contamination [×10¹⁰ atms/cm²] 23,000 — 313 | Contamination [×10¹⁰ atms/cm²] 91,000 — 314 | Contamination [×10¹⁰ atms/cm²] 200,000 — 315 | Contamination [×10¹⁰ atms/cm²] 25,000 — 316 | Contamination [×10¹⁰ atms/cm²] 20 — 317 |
| Hf | Contamination [×10¹⁰ atms/cm²] 170,000 — 221 | Contamination [×10¹⁰ atms/cm²] 170,000 — 322 | Contamination [×10¹⁰ atms/cm²] 35,000 — 323 | Contamination [×10¹⁰ atms/cm²] 100,000 — 324 | Contamination [×10¹⁰ atms/cm²] 170,000 — 325 | Contamination [×10¹⁰ atms/cm²] 67,000 — 326 | Contamination [×10¹⁰ atms/cm²] 170,000 — 327 |

FIG. 8

| Material | Ref. | CF4/CO/Ar 300/300/300 | CF4/Ar 300/300 | CF4/CO 300/300 | CF4/CO2/Ar 300/300/300 | NF3/CO/Ar 100/100/100 | CF4/CO/Ar 100/100/100 | CF4 300 only |
|---|---|---|---|---|---|---|---|---|
| Hf | Contamination [×10¹⁰atms/cm²] 170,000 | Contamination [×10¹⁰atms/cm²] 1,400 | Contamination [×10¹⁰atms/cm²] 67 | ✕ | Contamination [×10¹⁰atms/cm²] 180 | Contamination [×10¹⁰atms/cm²] 16,000 | Contamination [×10¹⁰atms/cm²] 95 | Contamination [×10¹⁰atms/cm²] 48 |
| Al | Contamination [×10¹⁰atms/cm²] 510,000 | Contamination [×10¹⁰atms/cm²] | Contamination [×10¹⁰atms/cm²] 1,200 | Contamination [×10¹⁰atms/cm²] 79,000 | Contamination [×10¹⁰atms/cm²] 76,000 | Contamination [×10¹⁰atms/cm²] 470,000 | Contamination [×10¹⁰atms/cm²] 26,000 | Contamination [×10¹⁰atms/cm²] 18,000 |

FIG. 9
| Material | Ref. | CF4/CO/Ar | CF4/CO |
|---|---|---|---|
| Hf |  | 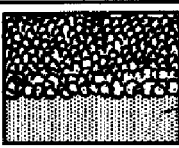 |  |
| | Contamination $[\times 10^{10} atms/cm^2]$ 170,000 | Contamination $[\times 10^{10} atms/cm^2]$ 95,000 | Contamination $[\times 10^{10} atms/cm^2]$ 67,000 |

FIG. 10

| Material | Ref. | DC-500V<br>CF4/CO/Ar<br>100/100/100 | DC-400V<br>CHF3/Ar/O2<br>100/100/100 | DC-400V<br>CHF3/Ar/O2<br>100/500/100 | CHF3/Ar/O2<br>100/800/100 | DC-900V<br>CHF3/Ar/O2<br>100/100/100 |
|---|---|---|---|---|---|---|
| Ti | Contamination<br>[×10¹⁰ atms/cm²]<br>210,000<br>711 | Contamination<br>[×10¹⁰ atms/cm²]<br>340<br>712 | Contamination<br>[×10¹⁰ atms/cm²]<br>82<br>713 | Contamination<br>[×10¹⁰ atms/cm²]<br>32<br>714 | Contamination<br>[×10¹⁰ atms/cm²]<br>16<br>715 | Contamination<br>[×10¹⁰ atms/cm²]<br>150<br>716 |
| Hf | Contamination<br>[×10¹⁰ atms/cm²]<br>170,000<br>721 | Contamination<br>[×10¹⁰ atms/cm²]<br>76<br>722 | Contamination<br>[×10¹⁰ atms/cm²]<br>420<br>723 | Contamination<br>[×10¹⁰ atms/cm²]<br>260<br>724 | Contamination<br>[×10¹⁰ atms/cm²]<br>210<br>725 | Contamination<br>[×10¹⁰ atms/cm²]<br>280<br>726 |
| Ta | Contamination<br>[×10¹⁰ atms/cm²]<br>170,000<br>731 | Contamination<br>[×10¹⁰ atms/cm²]<br>35<br>732 | Contamination<br>[×10¹⁰ atms/cm²]<br>710<br>733 | Contamination<br>[×10¹⁰ atms/cm²]<br>470<br>734 | Contamination<br>[×10¹⁰ atms/cm²]<br>890<br>735 | Contamination<br>[×10¹⁰ atms/cm²]<br>1,400<br>736 |

FIG. 11

| Material | Ref. | CHF3/Ar/O2 DC=0V | CHF3/Ar/O2 DC=-150V | CHF3/Ar/O2 DC=-300V |
|---|---|---|---|---|
| Al | Contamination [X10¹⁰atms/cm²] 510,000 | Contamination [X10¹⁰atms/cm²] 410,000 | Contamination [X10¹⁰atms/cm²] 660 | Contamination [X10¹⁰atms/cm²] 600 |
| | 741 | 742 | 743 | 744 |

US 9,653,317 B2

PLASMA PROCESSING METHOD AND PLASMA PROCESSING APPARATUS

CROSS-REFERENCE TO RELATED APPLICATION

This application claims the benefit of Japanese Patent Application Nos. 2013-221468 and 2014-164369 filed on Oct. 24, 2013, and Aug. 12, 2014, respectively, the entire disclosures of which are incorporated herein by reference.

TECHNICAL FIELD

The embodiments described herein pertain generally to a plasma processing method and a plasma processing apparatus.

BACKGROUND

In a semiconductor manufacturing process, a plasma processing apparatus configured to perform a plasma process for a thin film deposition or an etching is widely used. Such a plasma processing apparatus includes, for example, a plasma CVD (Chemical Vapor Deposition) apparatus configured to perform a thin film deposition process, a plasma etching apparatus configured to perform an etching process, and so forth.

Such a plasma processing apparatus includes a processing vessel for performing therein a plasma process on a processing target object, a sample table for holding the processing target object within the processing vessel, a gas supply system for introducing a required processing gas for a plasma reaction into the processing vessel, and so forth. Further, to excite the processing gas within the processing vessel into plasma, the plasma processing apparatus also includes a plasma generation device configured to supply electromagnetic energy such as a microwave or a RF wave, a bias voltage application device configured to apply a bias voltage to the sample table to accelerate ions in the plasma toward the processing target object held on the sample table, and so forth.

In the plasma processing apparatus, however, as the processing target object is plasma-processed, various kinds of deposits (reaction products, reaction by-products, etc) adhere to members (hereinafter, referred to as "in-vessel member") provided within the processing vessel. These deposits may be etched to be dispersed as contaminants when a next substrate is processed. Further, as substrates are processed, the deposits may be deposited within the processing vessel and fall down later, so that particles are generated. Accordingly, the deposits need to be removed. In this regard, Patent Document 1 describes a technique of removing a metal-containing deposit, which is generated when a processing target object containing a metal film such as a transition metal is plasma-processed and adheres to in-vessel members, by using plasma of a chlorine-based gas or a nitrogen-based gas.

Patent Document 1: Japanese Patent Laid-open Publication No. 2006-179834

Patent Document 2: Japanese Patent Laid-open Publication No. 2006-165246

However, in the conventional technique of using the chlorine-based gas or the nitrogen-based gas, the metal-containing deposit may not be removed efficiently if a metal having resistance to the plasma of the chlorine based gas or the nitrogen-based gas is contained in the deposit.

SUMMARY

In one example embodiment, a plasma processing method includes removing a deposit, which adheres to a member within a processing vessel and contains at least one of a transition metal and a base metal, by plasma of a processing gas containing a $C_xF_y$ gas, in which x is an integer equal to or less than 2 and y is an integer equal to or less than 6, and without containing a chlorine-based gas and a nitrogen-based gas.

In accordance with the example embodiment, a deposit, which adheres to a member within a processing vessel and contains at least one of a transition metal and a base metal, is removed by plasma of a processing gas containing a $C_xF_y$ gas, in which x is an integer equal to or less than 2 and y is an integer equal to or less than 6, and without containing a chlorine-based gas and a nitrogen-based gas.

The processing gas containing the $C_xF_y$ gas and without containing the chlorine-based gas and the nitrogen-based gas may be at least one of a $CF_4$ gas, a $CF_4/CO$ gas, a $CF_4/CO_2$ gas, a $CF_4/Ar$ gas, a $CF_4/CO/Ar$ gas, a $CF_4/CO_2/Ar$ gas, a $C_2F_6$ gas, a $C_2F_6/CO$ gas, a $C_2F_6/CO_2$ gas, a $C_2F_6/Ar$ gas, a $C_2F_6/CO/Ar$ gas, and a $C_2F_6/CO_2/Ar$ gas.

The transition metal may be at least one of Ti, Hf and Ta.

The base metal may be Al.

The plasma of the processing gas containing the $C_xF_y$ gas and without containing the chlorine-based gas and the nitrogen-based gas may be generated by applying high frequency powers to two facing electrodes within the processing vessel, respectively, and the deposit may be removed by the generated plasma.

The deposit may be removed by the plasma of the processing gas containing the $C_xF_y$ gas and without containing the chlorine-based gas and the nitrogen-based gas while applying a negative DC voltage to the member within the processing vessel.

In another example embodiment, a plasma processing method includes removing a deposit, which adheres to a member within a processing vessel and contains at least one of a transition metal and a base metal, by plasma of a processing gas containing a $CH_zF_w$ gas, in which z is an integer equal to or less than 3 and w is also an integer equal to or less than 3, and without containing a chlorine-based gas and a nitrogen-based gas while applying a negative DC voltage to the member within the processing vessel.

The processing gas containing the $CH_zF_w$ gas and without containing the chlorine-based gas and the nitrogen-based gas may be at least one of a $CHF_3$ gas, a $CHF_3/Ar/O_2$ gas, a $CH_2F_2$ gas, a $CH_2F_2/Ar/O_2$ gas, a $CH_3F$ gas, and a $CH_3F/Ar/O_2$ gas.

In yet another example embodiment, a plasma processing apparatus includes a processing vessel configured to perform therein a plasma process on a processing target object; a gas exhaust unit configured to depressurize an inside of the processing vessel; a gas supply unit configured to supply a processing gas into the processing vessel; and a controller configured to remove a deposit, which adheres to a member within the processing vessel and contains at least one of a transition metal and a base metal, by plasma of a processing gas containing a $C_xF_y$ gas, in which x is an integer equal to or less than 2 and y is an integer equal to or less than 6, and without containing a chlorine-based gas and a nitrogen-based gas.

In yet another example embodiment, a plasma processing apparatus includes a processing vessel configured to perform therein a plasma process on a processing target object; a gas exhaust unit configured to depressurize an inside of the processing vessel; a gas supply unit configured to supply a processing gas into the processing vessel; and a controller configured to remove a deposit, which adheres to a member within the processing vessel and contains at least one of a transition metal and a base metal, by plasma of a processing gas containing a $CH_zF_w$ gas, in which z is an integer equal to or less than 3 and w is also an integer equal to or less than 3, and without containing a chlorine-based gas and a nitrogen-based gas while applying a negative DC voltage to the member within the processing vessel.

According to various aspects and example embodiments, a plasma processing method and a plasma processing apparatus capable of removing a metal-containing deposit efficiently are provided.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 6 is a diagram showing processing results in experimental examples 1 to 6 and comparative examples 1 to 12;

FIG. 7 is a diagram showing processing results in the experimental examples 1 to 6 and the comparative examples 1 to 12;

FIG. 8 is a diagram showing processing results in experimental examples 7 to 16 and comparative examples 13 and 14;

FIG. 9 is a diagram showing processing results in experimental examples 17 and 18;

FIG. 10 is a diagram showing processing results in experimental examples 19 to 33;

FIG. 11 is a diagram showing processing results in experimental examples 34 and 35 and a comparative example 15.

DETAILED DESCRIPTION

Figure 1:
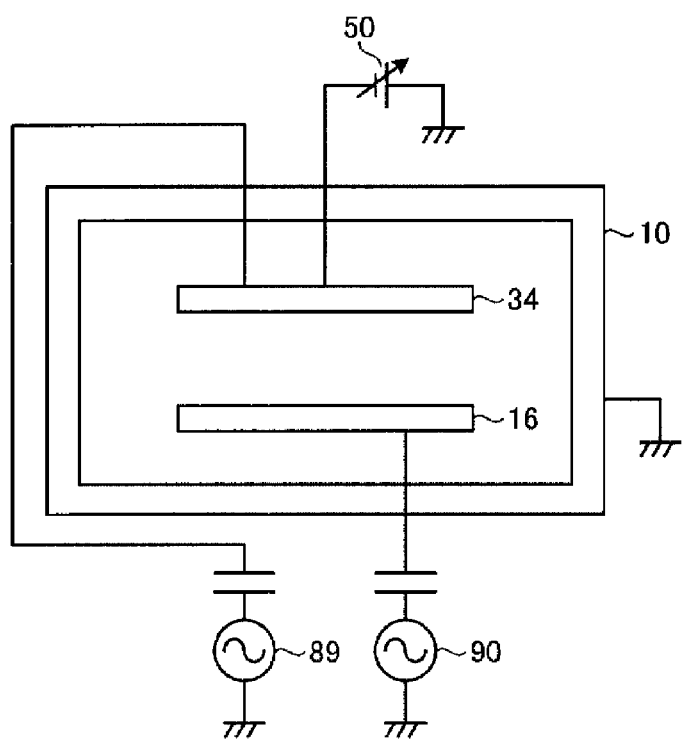
FIG. 1 is a simplified cross sectional view schematically illustrating a plasma processing apparatus in which a plasma processing method is performed in accordance with a first example embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current example embodiment. Still, the example embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, a plasma processing method and a plasma processing apparatus will be described in detail with reference to the accompanying drawings, which form a part hereof. In the drawings, same or corresponding parts will be assigned same reference numerals.

(Plasma Processing Apparatus in First Example Embodiment)

FIG. 1 is a simplified cross sectional view schematically illustrating a plasma processing apparatus in which a plasma processing method in accordance with a first example embodiment is performed. As depicted in FIG. 1, the plasma processing apparatus as a plasma etching apparatus is configured to apply dual RF powers to an upper electrode and a lower electrode, respectively. That is, the plasma processing apparatus is configured to apply a high frequency power RF for plasma generation having a frequency of, e.g., 40 MHz to an upper electrode 34 from a first high frequency power supply 89 and, also, apply a high frequency power RF for ion attraction having a frequency of, e.g., 2 MHz to a lower electrode 16 from a second high frequency power supply 90. In this plasma etching apparatus, a variable DC power supply 50 is connected with the upper electrode 34, and a preset DC voltage is applied thereto, as illustrated.

Figure 2:
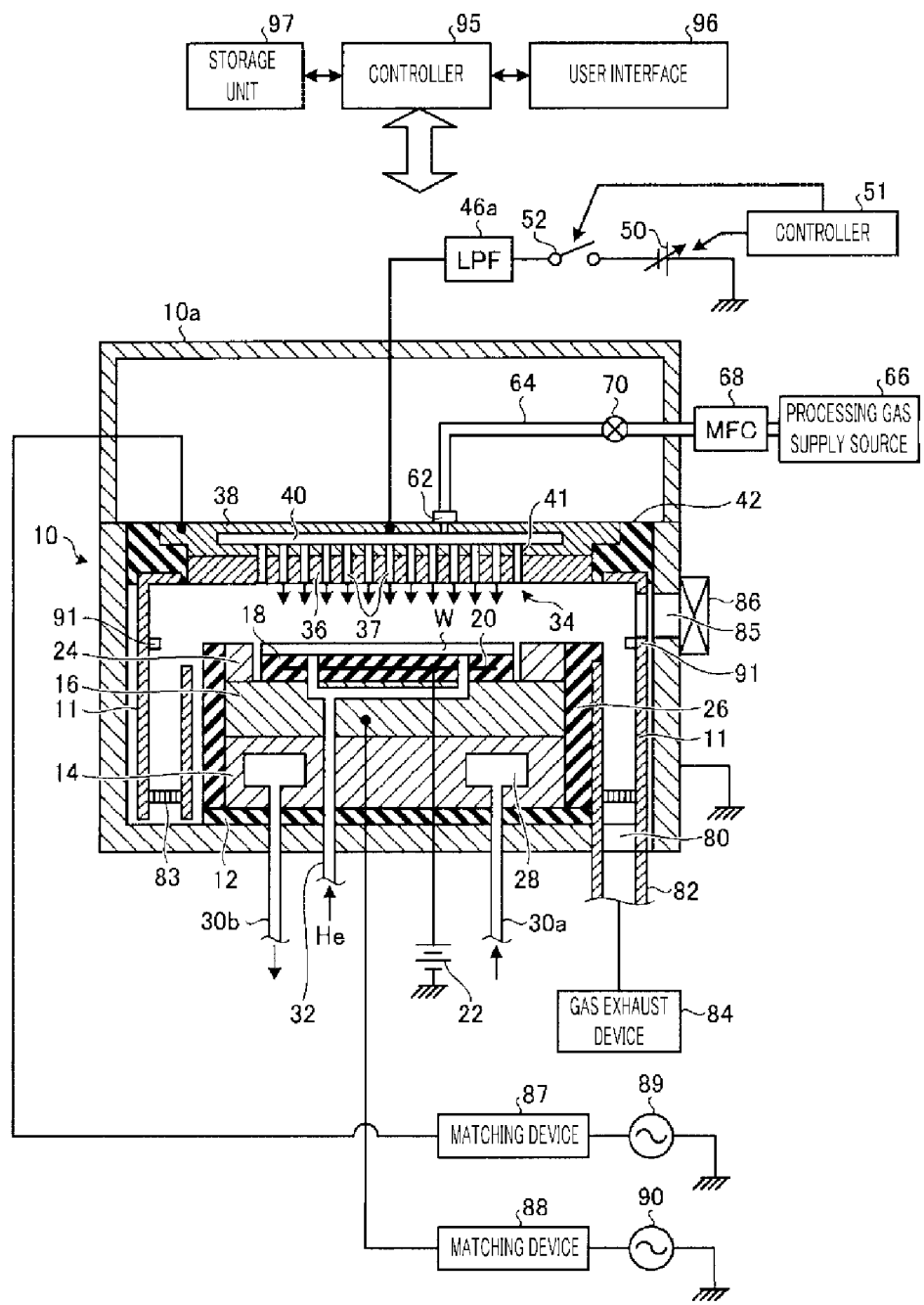
FIG. 2 is a schematic cross sectional view illustrating a configuration of the plasma processing apparatus in which the plasma processing method is performed in accordance with the first example embodiment.

FIG. 2 is a schematic cross sectional view illustrating a configuration of the plasma processing apparatus in which the plasma processing method in accordance with the first example embodiment is performed. The plasma processing apparatus is configured as a capacitively coupled parallel plate type plasma processing apparatus and includes a substantially cylindrical chamber (processing vessel) 10 made of, but not limited to, anodically oxidized aluminum. The chamber 10 is grounded.

A columnar susceptor supporting member 14 is provided on an insulating plate 12 made of, e.g., ceramics on a bottom of the chamber 10. The lower electrode 16, which is made of, but not limited to, aluminum, is provided on the susceptor supporting member 14, and a semiconductor wafer W as a processing target object is mounted on the lower electrode 16.

An electrostatic chuck 18 configured to attract and hold the semiconductor wafer W by an electrostatic force is provided on a top surface of the lower electrode 16. The electrostatic chuck 18 has a structure in which an electrode 20 made of a conductive film is provided between a pair of insulating layers or insulating sheets. The electrode 20 is electrically connected with a DC power supply 22. The insulating layers or insulating sheets may be made of, but not limited to, a dielectric material such as $Al_2O_3$ or $Y_2O_3$. The semiconductor wafer W is attracted to and held on the electrostatic chuck 18 by the electrostatic force such as a Coulomb force generated by applying a DC voltage from the DC power supply 22.

A conductive focus ring (correction ring) 24 configured to improve etching uniformity is provided on the top surface of the lower electrode 16 to surround the electrostatic chuck 18 (semiconductor wafer W). By way of example, but not limitation, the focus ring (correction ring) 24 may be made of silicon. A cylindrical inner wall member 26 made of, for example, quartz is provided on side surfaces of the lower electrode 16 and the susceptor supporting member 14.

A coolant path 28 is provided within the susceptor supporting member 14, for example, along the circumference thereof. A coolant of a preset temperature is supplied into and circulated through the coolant path 28 from a non-illustrated external chiller unit via pipelines 30a and 30b. A processing temperature of the semiconductor wafer W on the susceptor 16 is controlled to be in the range from, e.g., −20° C. to 200° C. by adjusting the temperature of the coolant.

Further, a heat transfer gas such as, but not limited to, a He gas from a non-illustrated heat transfer gas supply device is supplied into a gap between a top surface of the electrostatic chuck 18 and a rear surface of the semiconductor wafer W through a gas supply line 32.

The upper electrode 34 is provided above the lower electrode 16 to face the lower electrode 16 in parallel. A plasma generation space is formed between the upper electrode 34 and the lower electrode 16. The upper electrode 34 serves as a surface, i.e., a surface which faces the semiconductor wafer W on the lower electrode 16 and is in contact with the plasma generation space.

The upper electrode 34 is supported at a top portion of the chamber 10 via an insulating member 42. The upper electrode 34 faces the lower electrode 16. The upper electrode 34 includes an electrode plate 36 having a multiple number of gas discharge holes 37; and an electrode supporting body 38 configured to support the electrode plate 36 in a detachable manner. The electrode supporting body 38 is made of a conductive material and has a water cooling structure. The conductive material of the electrode supporting body 38 is, by way of example, but not limitation, aluminum having an anodically oxidized surface. The electrode plate 36 is made of a silicon-containing material, for example, silicon. The electrode supporting body 38 has therein a gas diffusion space 40, and a multiple number of gas through holes 41 communicating with the gas discharge holes 37 are extended downward from the gas diffusion space 40.

The electrode supporting body 38 has a gas inlet opening 62 through which a processing gas is introduced into the gas diffusion space 40. The gas inlet opening 62 is connected with a gas supply line 64, and the gas supply line 64 is connected with a gas supply source 66. The gas supply line 64 is equipped with a mass flow controller (MFC) 68 and an opening/closing valve 70 in sequence from the upstream side thereof. As a processing gas for etching, a fluorocarbon gas $C_xF_y$ such as a $CF_4$ gas or a gas containing $CH_zF_w$ gas such as $CHF_3$ is introduced into the gas diffusion space 40 from the gas supply source 66 through the gas supply line 64 and then is discharged into the plasma generation space through the gas through holes 41 and the gas discharge holes 37, in a shower device. That is, the upper electrode 34 serves as a shower head to supply the processing gas.

Further, a processing gas for performing a plasma process on the semiconductor wafer W, a processing gas for use in removing a deposit adhering to a member within the chamber 10, and so forth are also supplied from the processing gas supply source 66, as will be described later. Detailed description of the processing gases supplied from the processing gas supply source 66 will be elaborated later.

A variable DC power supply 50 is electrically connected with the upper electrode 34 via a low pass filter (LPF) 46a. Here, the variable DC power supply 50 may be a bipolar power supply. The variable DC power supply 50 is turned on and off by an on/off switch 52. A polarity and a current/voltage of the variable DC power supply 50 and an on/off operation of the on/off switch 52 are controlled by a controller (control device) 51.

The low pass filter (LPF) 46a is configured to trap high frequency powers supplied from a first high frequency power supply and a second high frequency power supply to be described below. Desirably, the low pass filter (LPF) 46a may be composed of a LR filter or a LC filter.

A cylindrical cover (grounding conductor) 10a is extended upward from a sidewall of the chamber 10 to be positioned higher than the upper electrode 34. The cover 10a has a shield function to suppress a high frequency power from being leaked.

The upper electrode 34 is electrically connected with a first high frequency power supply 89 via a matching device 87, and the lower electrode 16 is electrically connected with a second high frequency power supply 90 via a matching device 88. The first high frequency power supply 89 is configured to output a high frequency power of a frequency equal to or higher than 27 MHz, e.g., 40 MHz. The second high frequency power supply 90 is configured to output a high frequency power of a frequency equal to or lower than 13.56 MHz, e.g., 2 MHz. The first high frequency power supply 89 is for plasma generation, and the second high frequency power supply 90 is for bias application to the processing target object.

The matching device 87 and the matching device 88 are configured to match a load impedance with internal (or output) impedances of the first high frequency power supply 89 and the second high frequency power supply 90, respectively. The matching device 87 and the matching device 88 serve to control the internal impedances of the first high frequency power supply 89 and the second high frequency power supply 90 to be apparently matched with the load impedances, respectively, when generating plasma.

A gas exhaust opening 80 is formed on a bottom portion of the chamber 10. A gas exhaust device 84 is connected with the gas exhaust opening 80 via a gas exhaust line 82. The gas exhaust device 84 includes a vacuum pump such as a turbo molecular pump and is configured to depressurize an inside of the chamber 10 to a required vacuum level. Further, a loading/unloading opening 85 for the semiconductor wafer W is formed at the sidewall of the chamber 10, and the loading/unloading opening 85 is opened or closed by a gate valve 86. Further, a deposition shield 11 configured to suppress an etching byproduct (deposit) from adhering to the chamber 10 is detachably provided along an inner wall of the chamber 10. That is, the deposition shield 11 forms a chamber wall. The deposition shield 11 is also provided at a periphery of the inner wall member 26. Further, at the bottom portion of the chamber 10, a gas exhaust plate 83 is provided between the deposition shield 11 at the side of the chamber wall and the deposition shield 11 at the side of the inner wall member 26. Desirably, the deposition shield 11 and the gas exhaust plate 83 may be made of, but not limited to, aluminum coated with ceramics such as $Y_2O_3$.

A conductive member (GND block) 91 which is DC-connected with the ground is provided at a portion of the deposition shield 11 forming the inner wall of the chamber 10 to be located at a height position substantially same as the height position of the semiconductor wafer W. This conductive member 91 has an effect of suppressing an abnormal discharge, as will be described later. The conductive member 91 may be provided within a gas exhaust path under the lower electrode in a ring shape with respect to the lower electrode.

Individual components of the plasma processing apparatus are connected with and controlled by a controller (overall control device) 95. Further, connected with the controller 95 is a user interface 96 including a keyboard through which a process manager inputs a command to manage the plasma processing apparatus; a display that visually displays an operational status of the plasma processing apparatus, and so forth.

Also connected with the controller 95 is a storage unit 97 that stores therein control programs for implementing various processes in the plasma processing apparatus under the control of the controller 95, or programs for implementing a process in each component of the plasma processing apparatus according to processing conditions, i.e., processing recipes. The processing recipes may be stored in a hard disk or a semiconductor memory, or may be set at a preset position of the storage unit 97 while recorded on a computer-readable portable storage medium such as a CD-ROM or a DVD.

A preset recipe may be retrieved from the storage unit 97 as necessary and executed by the controller 95 in response to an instruction from the user interface 96 or the like, so that a desired process is performed in the plasma processing apparatus under the control of the controller 95.

By way of example, the controller 95 controls the individual components of the plasma processing apparatus to perform a plasma processing method to be described later. As a specific example, under the control of the controller 95, a deposit adhering to a member within the chamber 10 and containing at least one of a transition metal and a base metal is removed by being etched with the plasma of a processing gas containing a $C_xF_y$ gas (x is an integer equal to or less than 2 and y is an integer equal to or less than 6) or a $CH_zF_w$ gas (z is an integer equal to or less than 3 and w is an integer equal to or less than 3) and, also, without containing a chlorine-based gas and a nitrogen-based gas. Here, the member within the chamber 10 may include, for example, the inner wall of the chamber 10, the lower electrode 16 provided within the chamber 10, and the upper electrode 34 facing the lower electrode 16 within the chamber 10. Hereinafter, the member within the chamber 10 may be referred to as "in-chamber member." Here, a processing target object may be, by way of example, but not limitation, the semiconductor wafer W.

In the plasma processing apparatus having the above-described configuration, to perform an etching process on the processing target object, the gate valve 86 is opened, and the semiconductor wafer W as an etching target object is loaded into the chamber 10 through the loading/unloading opening 85 to be mounted on the lower electrode 16. Then, while supplying the processing gas for etching into the gas diffusion space 40 from the processing gas supply source 66 at a preset flow rate and, then, into the chamber 10 through the gas through holes 41 and the gas discharge holes 37, the inside of the chamber 10 is evacuated by the gas exhaust device 84, and an internal pressure of the chamber 10 is controlled to be a set value in the range from, e.g., 0.1 Pa to 150 Pa.

With the etching gas introduced into the chamber 10, the high frequency power for plasma generation is applied from the first high frequency power supply 89 to the upper electrode 34 at a preset power level, and the high frequency power for ion attraction is applied from the second high frequency power supply 90 to the lower electrode 16 at a certain power level. When necessary, a preset DC voltage is applied to the upper electrode 34 from the variable DC power supply 50. Further, the DC voltage is also applied to the electrode 20 of the electrostatic chuck 18 from the DC power supply 22 for the electrostatic chuck 18, so that the semiconductor wafer W is firmly held on the lower electrode 16 by the electrostatic force.

The processing gas discharged from the gas discharge holes 37 formed in the electrode plate 36 of the upper electrode 34 is excited into plasma between the upper electrode 34 and the lower electrode 16 by the high frequency power, and a processing target surface of the semiconductor wafer W is etched by radicals or ions in the plasma.

In the plasma processing apparatus, since the high frequency power in a high frequency range (e.g., 10 MHz or higher) is applied to the upper electrode 34 from the first high frequency power supply 89, the plasma can be highly densified in a desirable state. Accordingly, it is possible to generate the plasma with the high density under a lower pressure condition.

(Plasma Processing Method in First Example Embodiment)

Figure 3:
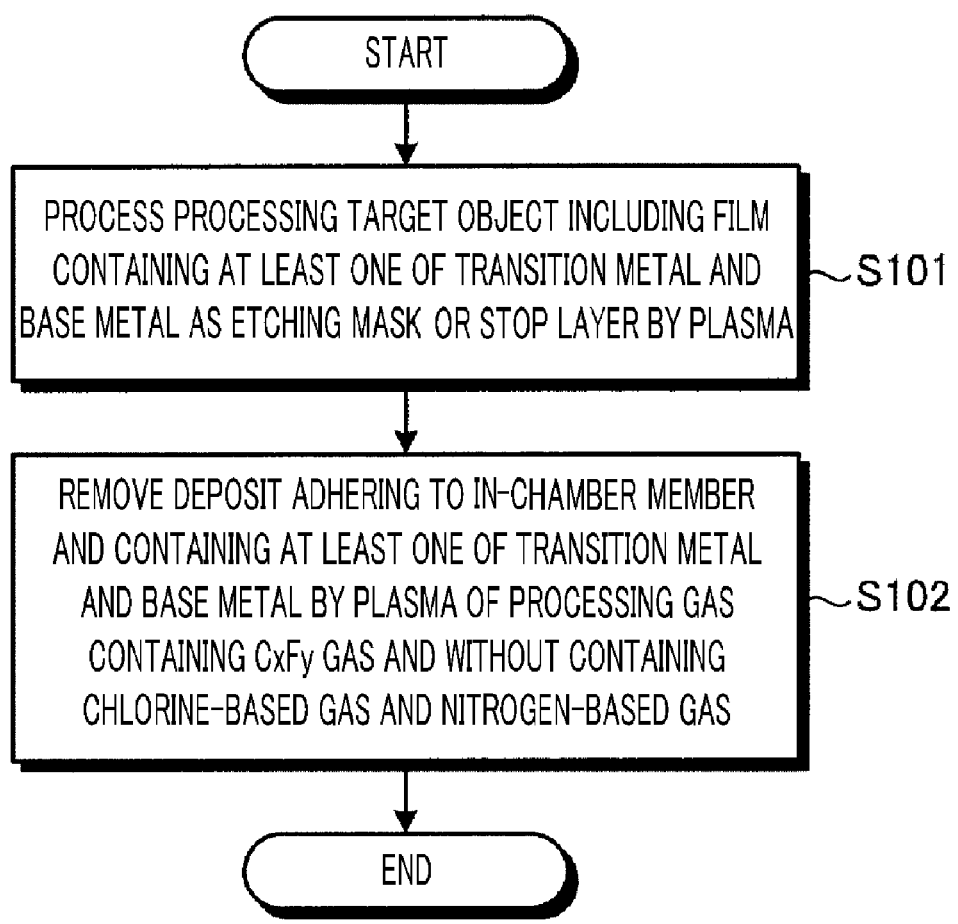
FIG. 3 is a flowchart for describing an example processing sequence of the plasma processing method performed in the plasma processing apparatus in accordance with the first example embodiment.

FIG. 3 is a flowchart for describing an example processing sequence of a plasma processing method performed in the plasma processing apparatus in accordance with the first example embodiment. As will be described in detail below, the plasma processing apparatus performs a series of processes on a processing target object including a film containing at least one of a transition metal and a base metal as an etching mask or a stop layer.

Here, the transition metal refers to at least one of, by way of example, but not limitation, Ti, Hf and Ta. Further, the base metal is, for example, Al.

As depicted in FIG. 3, the plasma processing apparatus performs a plasma process in which the processing target object is processed by plasma of a first processing gas (process S101 (Process Processing Target Object Including Film Containing at least One of Transition Metal and Base Metal as Etching Mask or Stop Layer by Plasma)). The first processing gas is, for example, a $N_2/O_2$ gas.

A more detailed example will be described. The controller 95 of the plasma processing apparatus loads the processing target object into the chamber 10 through the loading/unloading opening 85 and the gate valve 86 and mounts the loaded processing target object on the electrostatic chuck 18. Thereafter, the controller 95 supplies the first processing gas into the chamber 10 from the processing gas supply source 66, applies the first high frequency power for plasma generation from the first high frequency power supply 89 and applies the second high frequency power for ion attraction from the second high frequency power supply 90. As a result, the plasma of the first processing gas is generated within the chamber, and the processing target object is etched by the plasma. Accordingly, at least one of the transition metal and the base metal is dispersed from the etching mask or the stop layer of the processing target object, and a deposit containing at least one of the transition metal and the base metal adheres to the in-chamber member.

Then, the plasma processing apparatus performs a removing process in which the deposit containing the at least one of the transition metal and the base metal is removed by plasma of a second processing gas containing a $C_xF_y$ gas (x is an integer equal to or less than 2 and y is an integer equal to or less than 6) and without containing a chlorine-based gas and a nitrogen-based gas (process S102 (Remove Deposit Adhering to In-Chamber Member and Containing at least one of Transition Metal and Base Metal by Plasma of Processing Gas Containing $C_xF_y$ Gas and without Containing Chlorine-based Gas and Nitrogen-based Gas)). The second processing gas containing the $C_xF_y$ gas (x is an integer equal to or less than 2 and y is an integer equal to or less than 6) and without containing the chlorine-based gas and the nitrogen-based gas may be at least one of, but not limited to, a $CF_4$ gas, a $CF_4/CO$ gas, a $CF_4/CO_2$ gas, a $CF_4/Ar$ gas, a $CF_4/CO/Ar$ gas, a $CF_4/CO_2/Ar$ gas, a $C_2F_6$ gas, a $C_2F_6/CO$ gas, a $C_2F_6/CO_2$ gas, a $C_2F_6/Ar$ gas, a $C_2F_6/CO/Ar$ gas and a $C_2F_6/CO_2/Ar$ gas. Further, in the removing process, the internal pressure of the chamber 10 may be set to be in the range from 4 Pa to 13.3 Pa, desirably, and, more desirably, higher than 6.7 Pa and equal to or less than 13.3 Pa. Further, in the removing process, the high frequency power for plasma generation applied from the first high frequency power supply 89 and the high frequency power for ion attraction applied from the second high frequency power supply 90 may be set to be equal to or larger than 500 W and equal to or less than 2000 W, desirably. Furthermore, in case that the second processing gas used in the removing process contains $CF_4$, it may be desirable that a flow rate of the $CF_4$ is set to be equal to or larger than 300 sccm and equal to or less than 600 sccm. Further, in case that the second processing gas used in the removing process contains CO, it may be desirable that a flow rate of the CO is set to be equal to or larger than 150 sccm and equal to or less than 300 sccm. Further, in case that the second processing gas used in the removing process contains Ar, it may be desirable that a flow rate of the Ar is set to be equal to or larger than 50 sccm and equal to or less than 500 sccm.

A more detailed example will be described. The controller 95 of the plasma processing apparatus unloads the processing target object from the chamber 10 through the loading/unloading opening 85 and the gate valve 86. Then, the controller 95 supplies the second processing gas into the chamber 10 from the processing gas supply source 66, applies the first high frequency power for plasma generation from the first high frequency power supply 89 and applies the second high frequency power for ion attraction from the second high frequency power supply 90. As a result, the deposit containing the at least one of the transition metal and the base metal, which adheres to the in-chamber member, reacts with the plasma of the second processing gas, so that the deposit is removed from the in-chamber member.

As stated above, in accordance with the first example embodiment, the deposit containing at least one of the transition metal and the base metal is removed by the plasma of the processing gas containing the $C_xF_y$ gas (x is an integer equal to or less than 2 and y is an integer equal to or less than 6) and without containing the chlorine-based gas and the nitrogen-based gas. As a result, in case that the deposit contains a metal having resistance to the plasma of the chlorine-based gas or the nitrogen-based gas, the reaction between the plasma of the processing gas and the deposit can be accelerated. That is, the deposit containing the metal can be removed efficiently. Further, in accordance with the first example embodiment, since the deposit can be removed by performing the etching process without using a corrosion gas such as the chlorine-based gas or the nitrogen-based gas, modification of the specification of the apparatus for improving corrosion resistance or the like may not be required.

Furthermore, in accordance with the first example embodiment, the processing gas containing the $C_xF_y$ gas and without containing the chlorine-based gas and the nitrogen-based gas may be at least one of, but not limited to, a $CF_4$ gas, a $CF_4/CO$ gas, a $CF_4/CO_2$ gas, a $CF_4/Ar$ gas, a $CF_4/CO/Ar$ gas, a $CF_4/CO_2/Ar$ gas, a $C_2F_6$ gas, a $C_2F_6/CO$ gas, a $C_2F_6/CO_2$ gas, a $C_2F_6/Ar$ gas, a $C_2F_6/CO/Ar$ gas, and a $C_2F_6/CO_2/Ar$ gas. Thus, the deposit containing a metal including at least one of the transition metal and the base metal can be removed by plasma etching more efficiently.

In addition, according to the first example embodiment, the transition metal is at least one of Ti, Hf and Ta. Accordingly, even if a deposit containing at least one of Ti, Hf and Ta adheres to the in-chamber member of the plasma processing apparatus as a result of plasma-processing the processing target object including a film containing at least one of Ti, Hf and Ta as a mask or a stop layer, it is still possible to remove the deposit efficiently by plasma etching.

Further, in accordance with the first example embodiment, the base metal is Al. Accordingly, even if a deposit containing Al adheres to the in-chamber member of the plasma processing apparatus as a result of plasma-processing the processing target object including an Al-containing film as a mask or a stop layer, it is still possible to remove the deposit efficiently by plasma etching.

Furthermore, in accordance with the first example embodiment, by applying the high frequency powers to the lower electrode 16 and the upper electrode 34 facing each other within the chamber 10, respectively, the plasma of the processing gas containing the $C_xF_y$ gas and without containing the chlorine-based gas and the nitrogen-based gas is generated, and the deposit is removed by the generated plasma. As a result, an absolute value of a self-bias voltage in the surface of the in-chamber member can be increased, so that the deposit adhering to the in-chamber member can be appropriately sputtered and a surface of the in-chamber member can be cleaned.

Other Example Embodiments

In the above, the plasma processing method and the plasma processing apparatus in accordance with the first example embodiment have been described. However, the example embodiment may not be limited thereto. Below, other example embodiments will be described.

(DC Voltage)

For example, in a removing process, it is possible to remove a deposit from the in-chamber member, which is a target of which deposit is removed ("deposit removal target"), by plasma of a processing gas containing a $C_xF_y$ gas and without containing a chlorine-based gas and a nitrogen-based gas while applying a negative DC voltage to the in-chamber member. Desirably, the negative DC voltage applied to the in-chamber member is equal to or less than −100 V.

A more detailed example will be explained. Here, it is assumed that the in-chamber member as the deposit removal target is the upper electrode 34. The controller 95 of the plasma processing apparatus unloads a processing target object from the chamber 10 through the loading/unloading opening 85 and the gate valve 86. Then, the controller 95 supplies a second processing gas into the chamber 10 from the processing gas supply source 66, applies a first high frequency power for plasma generation from the first high frequency power supply 89 and applies a second high frequency power for ion attraction from the second high frequency power supply 90. Here, the second processing gas is, by way of example, but not limitation, a gas containing a $C_xF_y$ gas (x is an integer equal to or less than 2 and y is an integer equal to or less than 6) and without containing a chlorine-based gas and a nitrogen-based gas. Here, at least one of a $CF_4/Ar$ gas, a $CF_4/CO/Ar$ gas, a $CF_4/CO_2/Ar$ gas, a $C_2F_6/Ar$ gas, a $C_2F_6/CO/Ar$ gas, and a $C_2F_6/CO_2/Ar$ gas is supplied into the chamber 10 as the second processing gas. Further, the controller 95 connects the variable DC power supply 50 with the upper electrode 34 as the deposit removal target and applies a preset DC voltage to the upper electrode 34. That is, the controller 95 applies a negative DC voltage having preset polarity and magnitude to the upper electrode 34 from the variable DC power supply 50 when plasma is generated. More desirably, the negative DC voltage is applied to the upper electrode 34 from the variable DC power supply 50 such that a self-bias voltage ($V_{dc}$) in the surface of the electrode plate 36 is increased to achieve a sputtering effect on the surface of the electrode plate 36 serving as the surface of the upper electrode 34, i.e., such that an absolute value of the self-bias voltage $V_{dc}$ in the surface of the upper electrode 34 is increased. Here, as the negative DC voltage, a DC voltage equal to or less than, e.g., −100 V is applied to the upper electrode 34.

As a result, collision of ions against the surface of the upper electrode 34 is accelerated, so that the amount of the deposit removed from the surface of the upper electrode 34 is increased. By way of example, argon ions in the plasma may collide with the surface of the upper electrode 34, so that the deposit adhering to the upper electrode 34 would be appropriately sputtered and, thus, the surface of the upper electrode 34 can be cleaned.

(Kinds of Processing Gas)

In the first example embodiment as described above, the gas containing the $C_xF_y$ gas and without containing the chlorine-based gas and the nitrogen-based gas is used as a processing gas for removing the deposit. However, the processing gas may not be limited thereto. By way of example, a gas containing a $CH_zF_w$ gas (z is an integer equal to or less than 3 and w is also an integer equal to or less than 3) and without containing the chlorine-based gas and the nitrogen-based gas may also be used as the processing gas for removing the deposit. In this case, in the removing process, the plasma processing apparatus removes the deposit by plasma of the processing gas containing the $CH_zF_w$ gas and without containing the chlorine-based gas and the nitrogen-based gas while applying the negative DC voltage to the in-chamber member which is a deposit removal target. The processing gas containing the $CH_zF_w$ gas and without containing the chlorine-based gas and the nitrogen-based gas may be at least one of, but not limited to, a $CHF_3$ gas, a $CHF_3/Ar/O_2$ gas, a $CH_2F_2$ gas, a $CH_2F_2/Ar/O_2$ gas, a $CH_3F$ gas, and a $CH_3F/Ar/O_2$ gas. Further, the negative DC voltage applied to the in-chamber member is desirably equal to or less than −100 V.

A more detailed example will be explained. Here, it is assumed that the in-chamber member as the deposit removal target is the upper electrode 34. The controller 95 of the plasma processing apparatus unloads a processing target object from the chamber 10 through the loading/unloading opening 85 and the gate valve 86. Then, the controller 95 supplies a second processing gas into the chamber 10 from the processing gas supply source 66, applies a first high frequency power for plasma generation from the first high frequency power supply 89 and applies a second high frequency power for ion attraction from the second high frequency power supply 90. Here, the second processing gas is, by way of example, but not limitation, a gas containing a $CH_zF_w$ gas (z is an integer equal to or less than 3 and w is also an integer equal to or less than 3) and without containing a chlorine-based gas and a nitrogen-based gas. Here, at least one of a $CHF_3/Ar/O_2$ gas, a $CH_2F_2/Ar/O_2$ gas, a $CH_3F$ gas, and a $CH_3F/Ar/O_2$ gas is supplied into the chamber 10 as the second processing gas. Further, the controller 95 connects the variable DC power supply 50 with the upper electrode 34 as the deposit removal target and applies a preset DC voltage to the upper electrode 34. That is, the controller 95 applies a negative DC voltage having preset polarity and magnitude to the upper electrode 34 from the variable DC power supply 50 when plasma is generated. More desirably, the negative DC voltage is applied to the upper electrode 34 from the variable DC power supply 50 such that a self-bias voltage ($V_{dc}$) in the surface of the electrode plate 36 is increased to achieve a sputtering effect on the surface of the electrode plate 36 serving as the surface of the upper electrode 34, i.e., such that an absolute value of the self-bias voltage $V_{dc}$ in the surface of the upper electrode 34 is increased. Here, as the negative DC voltage, a DC voltage equal to or less than, e.g., −100 V is applied to the upper electrode 34.

As a result, collision of ions against the surface of the upper electrode 34 is accelerated, so that the amount of the deposit removed from the surface of the upper electrode 34 is increased. By way of example, argon ions in the plasma may collide with the surface of the upper electrode 34, so that the deposit adhering to the upper electrode 34 would be appropriately sputtered and, thus, the surface of the upper electrode 34 can be cleaned.

(Kinds of Plasma Processing Apparatus)

In the first example embodiment, the plasma etching apparatus configured to apply a single RF power and a DC voltage to the upper electrode and apply a single RF power to the lower electrode, as shown in FIG. 1, is used as the plasma processing apparatus in which the plasma processing method is performed. However, the plasma processing apparatus may not be limited thereto. By way of example, a plasma etching apparatus configured to apply a single RF power to a lower electrode, a plasma etching apparatus configured to apply a single RF power to a lower electrode and apply a negative DC voltage to an upper electrode, a plasma etching apparatus configured to apply dual RF powers to a lower electrode and a DC voltage to an upper electrode, a plasma etching apparatus configured to apply dual RF powers to an upper electrode and a lower electrode, respectively, and apply a DC voltage to the upper electrode, an ICP (Inductively Coupled Plasma) etching apparatus, a microwave plasma etching apparatus, or the like may also be applicable.

Figure 4A:
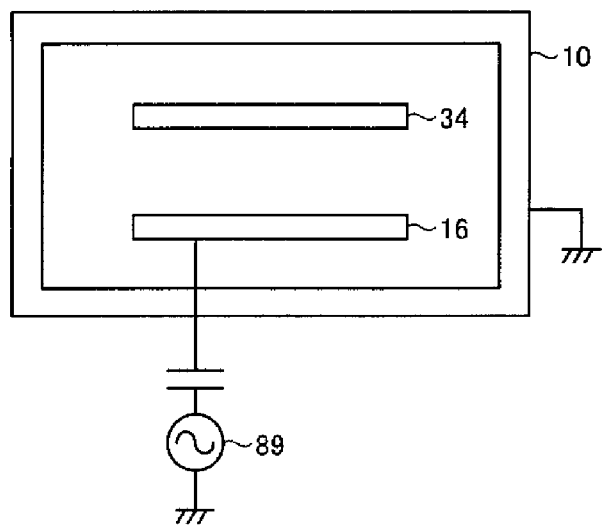
FIG. 4A is a simplified cross sectional view schematically illustrating a plasma etching apparatus configured to apply a single RF power to a lower electrode.

FIG. 4A is a simplified cross sectional view schematically illustrating a plasma etching apparatus configured to apply a single RF power to a lower electrode. In FIG. 4A, the same parts as those shown in FIG. 1 are assigned same reference numerals, and redundant description is omitted. As depicted in FIG. 4A, the plasma etching apparatus configured to apply a single RF power to the lower electrode applies a high frequency (RF) power of, e.g., 40 MHz for plasma generation to a lower electrode 16 from a first high frequency power supply 89. In this configuration, a variable DC power supply 50 and a second high frequency power supply 90 are omitted.

Figure 4B:
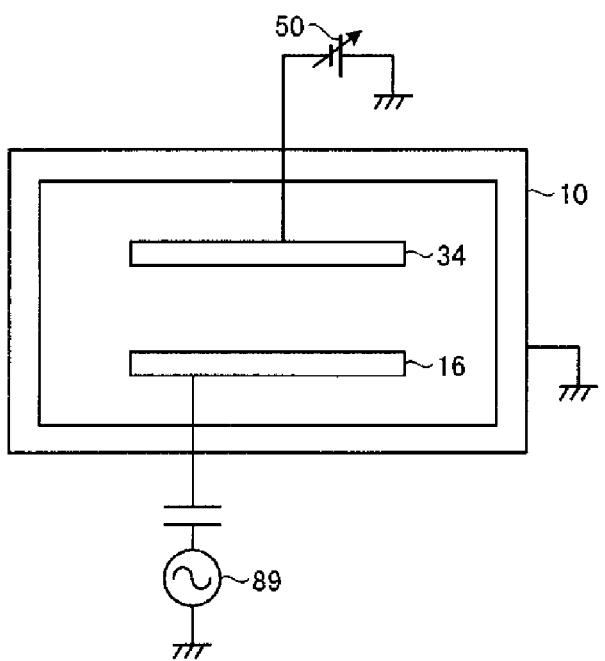
FIG. 4B is a simplified cross sectional view schematically illustrating a plasma etching apparatus configured to apply a single RF power to a lower electrode and a negative DC voltage to an upper electrode.

FIG. 4B is a simplified cross sectional view schematically illustrating a plasma etching apparatus configured to apply a single RF power to a lower electrode and a negative DC voltage to an upper electrode. In FIG. 4B, the same parts as those shown in FIG. 1 are assigned same reference numerals, and redundant description is omitted. The plasma etching apparatus shown in FIG. 4B is configured to apply a high frequency (RF) power of, e.g., about 40 MHz for plasma generation to a lower electrode 16 from a first high frequency power supply 89. Further, as depicted in FIG. 4B, a variable DC power supply 50 is connected with an upper electrode 34, and a preset DC voltage is applied to the upper electrode 34. In this configuration, a second high frequency power supply 90 is omitted.

Figure 5:
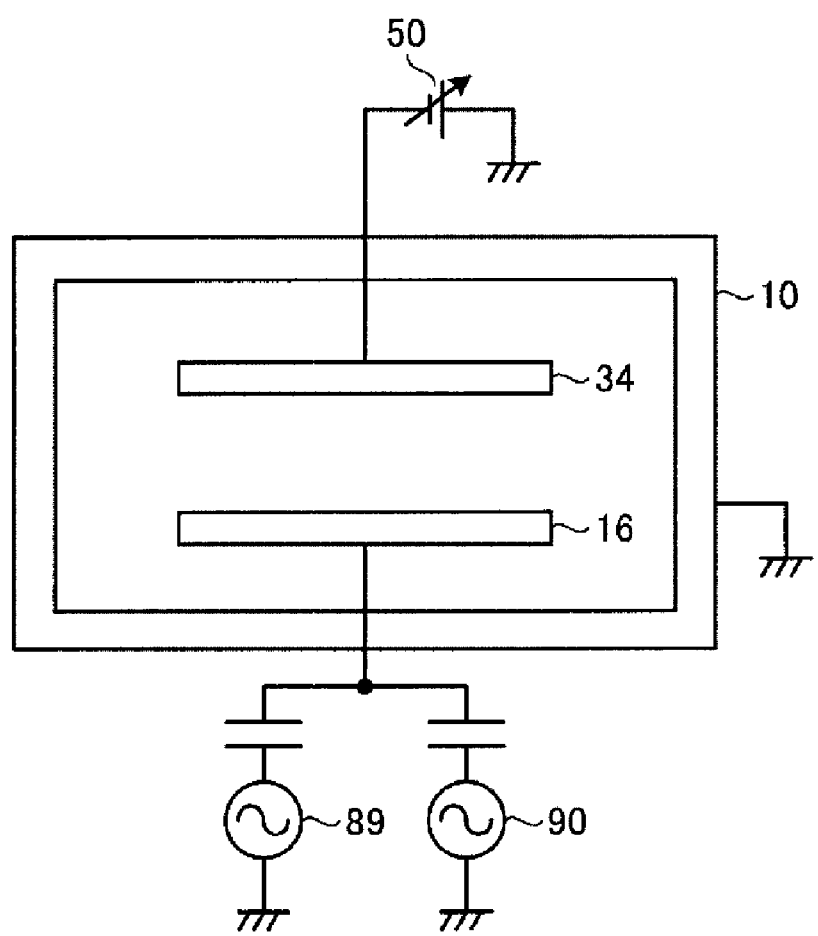
FIG. 5 is a simplified cross sectional view schematically illustrating a plasma etching apparatus configured to apply dual RF powers to a lower electrode.

FIG. 5 is a simplified cross sectional view schematically illustrating a plasma etching apparatus configured to apply dual RF powers to a lower electrode. In FIG. 5, the same parts as those shown in FIG. 1 are assigned same reference numerals, and redundant description is omitted. As shown in FIG. 5, the plasma etching apparatus depicted in FIG. 5 is configured to apply, to a lower electrode 16, a high frequency (RF) power of, e.g., 40 MHz for plasma generation from a first high frequency power supply 89 and a high frequency (RF) power of, e.g., 2 MHz for ion attraction from a second high frequency power supply 90. Further, as illustrated in FIG. 5, a variable DC power supply 50 is connected with an upper electrode 34, and a preset DC voltage is applied to the upper electrode 34.

EXPERIMENTAL EXAMPLES

Below, the above-stated plasma processing method will be discussed in further detail with reference to experimental examples. Here, however, the plasma processing method is not limited to the experimental examples.

Experimental Examples 1 to 4

A semiconductor wafer W including a film containing a transition metal X is plasma-processed. Then, there is performed a removing process in which a deposit containing the transition metal X and adhering to an upper electrode 34 is removed by using plasma of a processing gas G1 containing a $C_xF_y$ gas (x is an integer equal to or less than 2 and y is an integer equal to or less than 6) and, also, without containing a chlorine-based gas and a nitrogen-based gas. Processing conditions for the removing process are as follows.

Kind of plasma processing apparatus: a plasma etching apparatus configured to apply dual RF powers to an upper electrode and a lower electrode, respectively Pressure: 4.0 Pa (30 mT)

High frequency power (HF/LF): 500 W/250 W

Temperature (upper/sidewall/lower): 60° C./60° C./20° C.

Time: 180 seconds

Further, in the experimental examples 1 to 4, following metals are used as the transition metal X.

Experimental examples 1 and 2: Ti (Titanium)

Experimental examples 3 and 4: Hf (Hafnium)

In addition, in the experimental examples 1 to 4, following gases having flow rates as specified below are used as the processing gas G1.

Experimental examples 1 and 3: $CF_4/CO$=300 sccm/300 sccm

Experimental examples 2 and 4: $CF_4/CO/Ar$=300 sccm/300 sccm/300 sccm

After the completion of the removing process in each experimental example, a metal contamination amount on the surface of the upper electrode 34 is measured. The metal contamination amount is an index indicating an adhesion amount of metal atoms per a unit area. In measuring the metal contamination amount, the metal contamination amount on the surface of the upper electrode 34 is not directly measured. That is, a Si substrate for testing is provided on the surface of the upper electrode 34, and a metal contamination amount on the surface of the Si substrate for testing is measured as the metal contamination amount on the surface of the upper electrode 34.

Experimental Examples 5 and 6

A semiconductor wafer W including a film containing a transition metal X is plasma-processed. Then, there is performed a removing process in which, while applying a negative DC voltage to an upper electrode 34, a deposit containing the transition metal X and adhering to an upper electrode 34 is removed by using plasma of a processing gas G1 containing a $C_xF_y$ gas (x is an integer equal to or less than 2 and y is an integer equal to or less than 6) and, also, without containing a chlorine-based gas and a nitrogen-based gas. Processing conditions for the removing process are as follows.

Kind of plasma processing apparatus: a plasma etching apparatus configured to apply dual RF powers to the upper electrode and the lower electrode, respectively Pressure: 4.0 Pa (30 mT)

High frequency power (HF/LF): 500 W/250 W

DC voltage applied to upper electrode: −500 V

Temperature (upper/sidewall/lower): 60° C./60° C./20° C.

Time: 180 seconds

Further, in the experimental examples 5 and 6, following metals are used as the transition metal X.

Experimental example 5: Ti (Titanium)

Experimental example 6: Hf (Hafnium)

In addition, in the experimental examples 5 and 6, following gases having flow rates as specified below are used as the processing gas G1.

Experimental examples 5 and 6: $CF_4/CO/Ar$=300 sccm/300 sccm/300 sccm

After the completion of the removing process in each comparative example, a metal contamination amount on the surface of the upper electrode 34 is measured. The metal contamination amount is an index indicating an adhesion amount of metal atoms per a unit area. In measuring the metal contamination amount, the metal contamination amount on the surface of the upper electrode 34 is not directly measured. That is, a Si substrate for testing is provided on the surface of the upper electrode 34, and a metal contamination amount on the surface of the Si substrate for testing is measured as the metal contamination amount on the surface of the upper electrode 34.

Comparative Examples 1 to 6

In comparative examples 1 to 6, unlike in the experimental examples 1 and 2, there is performed a removing process in which a deposit adhering to an upper electrode 34 and containing a transition metal X is removed by plasma of a processing gas G2 containing a chlorine-based gas or a nitrogen-based gas. Processing conditions for the removing process are as follows.

Kind of plasma processing apparatus: a plasma etching apparatus configured to apply dual RF powers to a lower electrode Pressure: 4.0 Pa (30 mT)

High frequency power (HF/LF): 1000 W/250 W

Temperature (upper/sidewall/lower): 100° C./80° C./25° C.

Time: 180 seconds

In addition, in the comparative examples 1 to 6, following gases having flow rates as specified below are used as the processing gas G2. The other processing conditions in the comparative examples 1 to 6 are the same as those in the experimental examples 1 and 2.

Comparative example 1: $NF_3$=120 sccm
Comparative example 2: $BCl_3$=200 sccm
Comparative example 3: $Cl_2$=200 sccm
Comparative example 4: $BCl_3$/Ar=125 sccm/75 sccm
Comparative example 5: $BCl_3$/$Cl_2$=125 sccm/75 sccm
Comparative example 6: $Cl_2$/$NF_3$=150 sccm/50 sccm Comparative Examples 7 to 12

In comparative examples 7 to 12, unlike in the experimental examples 3 and 4, there is performed a removing process in which a deposit adhering to an upper electrode 34 and containing a transition metal X is removed by plasma of a processing gas G2 containing a chlorine-based gas or a nitrogen-based gas. Processing conditions for the removing process are as follows.

Kind of the plasma processing apparatus: a plasma etching apparatus configured to apply dual RF powers to a lower electrode Pressure: 4.0 Pa (30 mT)

High frequency power (HF/LF): 1000 W/250 W

Temperature (upper/sidewall/lower): 100° C./80° C./25° C.

Time: 180 seconds

In addition, in the comparative examples 7 to 12, following gases having flow rates as specified below are used as the processing gas G2. The other processing conditions in the comparative examples 7 to 12 are the same as those in the experimental examples 3 and 4.

Comparative example 7: $NF_3$=120 sccm
Comparative example 8: $BCl_3$=200 sccm
Comparative example 9: $Cl_2$=200 sccm
Comparative example 10: $BCl_3$/Ar=125 sccm/75 sccm
Comparative example 11: $BCl_3$/$Cl_2$=125 sccm/75 sccm
Comparative example 12: $Cl_2$/$NF_3$=150 sccm/50 sccm (Processing Results in Experimental Examples 1 to 6 and Comparative Examples 1 to 12)

FIG. 6 and FIG. 7 are diagrams showing processing results in the experimental examples 1 to 6 and the comparative examples 1 to 12. Traced drawings 211 of FIG. 6 and FIG. 7 show surface states of Si substrates for testing before performing the removing processes in the experimental examples 1 and 2 and the comparative examples 1 to 6. Traced drawings 221 show a surface state of a Si substrate for testing before performing the removing processes in the experimental examples 3 and 4 and the comparative examples 7 to 12. Further, traced drawings 212, 213, 222 and 223 of FIG. 6 show surface states of the Si substrates for testing after performing the removing processes in the experimental examples 1 to 4, respectively. Traced drawings 214 and 224 of FIG. 6 show surface states of the Si substrates for testing after performing the removing processes in the experimental examples 5 and 6, respectively. Further, traced diagrams 312 to 317 of FIG. 7 show surface states of the Si substrates for testing after performing the removing processes in the comparative examples 1 to 6, respectively. Traced drawings 322 to 327 of FIG. 7 show surface states of the Si substrates for testing after performing the removing processes in the comparative examples 7 to 12, respectively. In each traced drawing, a metal contamination amount ($\times 10^{10}$ atms/cm$^2$) is also specified.

As depicted in FIG. 6 and FIG. 7, in the removing processes of removing Ti, the metal contamination amounts are found to be reduced in the experimental examples 1 and 2 in which the processing gas G1 containing the $C_xF_y$ gas (x is an integer equal to or less than 2 and y is an integer equal to or less than 6) and without containing a chlorine-based gas and a nitrogen-based gas is used, as compared to the comparative examples 1 to 6 in which the processing gas G2 containing the chlorine-based gas or the nitrogen-based gas is used. That is to say, in the experimental examples 1 and 2, a deposit containing Ti as the transition metal can be removed efficiently, as compared to the comparative examples 1 to 6.

Further, as depicted in FIG. 6 and FIG. 7, in the removing processes of removing Hf, the metal contamination amounts are found to be reduced in the experimental examples 3 and 4 in which the processing gas G1 containing the $C_xF_y$ gas (x is an integer equal to or less than 2 and y is an integer equal to or less than 6) and without containing a chlorine-based gas and a nitrogen-based gas is used, as compared to the comparative examples 7 to 12 in which the processing gas G2 containing the chlorine-based gas or the nitrogen-based gas is used. That is to say, in the experimental examples 3 and 4, a deposit containing Hf as the transition metal can be removed efficiently, as compared to the comparative examples 7 to 12.

Moreover, as can be seen from FIG. 6, in the removing processes of removing Ti, the metal contamination amount in the experimental example 5 in which the negative DC voltage is applied to the upper electrode 34 is found to be reduced to the substantially same level as those in the experimental examples 1 and 2 in which the negative DC voltage is not applied to the upper electrode 34.

In addition, as depicted in FIG. 6, in the removing processes of removing Hf, the metal contamination amount in the experimental example 6 in which the negative DC voltage is applied to the upper electrode 34 is found to be reduced to the substantially same level as those in the experimental examples 3 and 4 in which the negative DC voltage is not applied to the upper electrode 34.

Experimental Examples 7 to 10

In experimental examples 7 to 10, unlike in the experimental examples 3 and 4, following gases having flow rates as specified below are utilized as the processing gas G1. The other processing conditions are the same as those in the experimental examples 1 and 2.

Experimental example 7: $CF_4$/Ar=300 sccm/300 sccm
Experimental example 8: $CF_4$/$CO_2$/Ar=300 sccm/300 sccm/300 sccm
Experimental example 9: $CF_4$/CO/Ar=100 sccm/100 sccm/100 sccm
Experimental example 10: $CF_4$=300 sccm Experimental Examples 11 to 16

A semiconductor wafer W including a film containing Al (aluminum), which is a base metal, is plasma-processed.

Then, there is performed a removing process in which a deposit containing Al and adhering to an upper electrode 34 is removed by being etched with plasma of a processing gas G1 containing a $C_xF_y$ gas (x is an integer equal to or less than 2 and y is an integer equal to or less than 6) and, also, without containing a chlorine-based gas and a nitrogen-based gas. Processing conditions for the removing process are as follows.

Kind of plasma processing apparatus: a plasma etching apparatus configured to apply dual RF powers to an upper electrode and a lower electrode, respectively Pressure: 4.0 Pa (30 mT)
High frequency power (HF/LF): 500 W/250 W
Temperature (upper/sidewall/lower): 60° C./60° C./20° C.

Further, in the experimental examples 11 to 16, following gases having flow rates as specified below are used as the processing gas G1.

Experimental example 11: $CF_4$/CO/Ar=300 sccm/300 sccm/300 sccm
Experimental example 12: $CF_4$/Ar=300 sccm/300 sccm
Experimental example 13: $CF_4$/CO=300 sccm/300 sccm
Experimental example 14: $CF_4$/$CO_2$/Ar=300 sccm/300 sccm/300 sccm
Experimental example 15: $CF_4$/CO/Ar=100 sccm/100 sccm/100 sccm
Experimental example 16: $CF_4$=300 sccm After the completion of the removing process in each experimental example, a metal contamination amount on the surface of the upper electrode 34 is measured. The metal contamination amount is an index indicating an adhesion amount of metal atoms per a unit area. In measuring the metal contamination amount, the metal contamination amount on the surface of the upper electrode 34 is not directly measured. That is, a Si substrate for testing is provided on the surface of the upper electrode 34, and a metal contamination amount on the surface of the Si substrate for testing is measured as the metal contamination amount on the surface of the upper electrode 34.

Comparative Example 13

In a comparative example 13, unlike in the experimental example 9, there is performed a removing process in which a deposit adhering to the upper electrode 34 and containing Hf, which is a transition metal, is removed by being etched with plasma of a processing gas containing a nitrogen-based gas, i.e., $NF_3$/CO/Ar=100 sccm/100 sccm/100 sccm. The other processing conditions are the same as those in the experimental example 9.

Comparative Example 14

In a comparative example 14, unlike in the experimental example 15, there is performed a removing process in which a deposit adhering to the upper electrode 34 and containing Al, which is a base metal, is removed by being etched by plasma of a processing gas containing a nitrogen-based gas, i.e., $NF_3$/CO/Ar=100 sccm/100 sccm/100 sccm. The other processing conditions are the same as those in the experimental example 15.

(Processing Results in Experimental Examples 7 to 16 and Comparative Examples 13 and 14)

FIG. 8 is a diagram showing processing results in the experimental examples 7 to 16 and the comparative examples 13 and 14. A traced drawing 221 of FIG. 8 corresponds to the traced drawing 221 in FIG. 6 and FIG. 7. Further, a traced drawing 231 in FIG. 8 shows surface states of Si substrates for testing before performing the removing processes in the experimental examples 7 to 16. Traced drawings 413 and 415 to 417 show surface states of the Si substrates for testing after performing the removing processes in the experimental examples 7 to 10. Further, traced drawings 422 to 427 show surface states of the Si substrates for testing after performing the removing processes in the experimental examples 11 to 16. Traced drawings 512 and 522 show surface states of Si substrates for testing after performing the removing processes in the comparative examples 13 and 14, respectively. In each traced drawing, a metal contamination amount ($\times 10^{10}$ atms/cm$^2$) is also specified.

As depicted in FIG. 6 and FIG. 8, by using $CF_4$/Ar in the removing processes of removing Hf or Al, it is possible to reduce the metal contamination amounts to the substantially same level as those in case of using $CF_4$/CO or $CF_4$/CO/Ar.

Further, as shown in FIG. 6 and FIG. 8, by using $CF_4$/$CO_2$/Ar in the removing processes of removing Hf or Al, it is possible to reduce the metal contamination amounts to the substantially same level as those in case of using $CF_4$/CO or $CF_4$/CO/Ar.

Moreover, as shown in FIG. 6 and FIG. 8, by using $CF_4$ in the removing processes of removing Hf or Al, it is possible to reduce the metal contamination amounts to the substantially same level as those in case of using $CF_4$/CO or $CF_4$/CO/Ar.

In addition, as depicted in FIG. 8, by using $CF_4$/CO/Ar in the removing processes of removing Hf or Al, the metal contamination amounts are found to be reduced, as compared to the case of using $NF_3$/CO/Ar. That is to say, in the experimental examples 9 and 15, a deposit containing Hf as a transition metal or a deposit containing Al as a base metal can be removed efficiently, as compared to the comparative examples 13 and 14.

Experimental Examples 17 and 18

In experimental examples 17 and 18, unlike in the experimental examples 1 to 16, a series of processes are performed by using a plasma etching apparatus configured to apply a single RF power to a lower electrode instead of the plasma etching apparatus configured to apply dual RF powers to the upper electrode and the lower electrode, respectively. That is, a semiconductor wafer W including a film containing Hf, which is a transition metal, is plasma-processed. Then, there is performed a removing process in which a deposit containing Hf and adhering to an upper electrode 34 is removed by using plasma of a processing gas G1 containing a $C_xF_y$ gas (x is an integer equal to or less than 2 and y is an integer equal to or less than 6) and, also, without containing a chlorine-based gas and a nitrogen-based gas. Processing conditions for the removing process are as follows.

Kind of plasma processing apparatus: a plasma etching apparatus configured to apply a single RF power to a lower electrode Pressure: 4.0 Pa (30 mT)
High frequency power: 1000 W
Temperature (upper/sidewall/lower): 100° C./60° C./0° C.
Time: 180 seconds Further, in the experimental examples 17 and 18, following gases having flow rates as specified below are used as the processing gas G1.

Experimental example 17: $CF_4$/CO/Ar=300 sccm/300 sccm/300 sccm
Experimental example 18: $CF_4$/CO=300 sccm/300 sccm After the completion of the removing process in each experimental example, a metal contamination amount on the surface of the upper electrode 34 is measured. The metal contamination amount is an index indicating an adhesion amount of metal atoms per a unit area. In measuring the metal contamination amount, the metal contamination amount on the surface of the upper electrode 34 is not directly measured. That is, a Si substrate for testing is provided on the surface of the upper electrode 34, and a metal contamination amount on the surface of the Si substrate for testing is measured as the metal contamination amount on the surface of the upper electrode 34.

(Processing Results in Experimental Examples 17 and 18)

FIG. 9 is a diagram showing processing results in the experimental examples 17 and 18. A traced drawing 221 of FIG. 9 corresponds to the traced drawings 221 of FIG. 6 and FIG. 7. Further, traced drawings 612 and 613 show surface states of Si substrates for testing after performing the removing processes in the experimental examples 17 and 18. In each traced drawing, a metal contamination amount ($\times 10^{10}$ atms/cm$^2$) is also specified.

As shown in FIG. 9, when the plasma etching apparatus configured to apply a single RF power to the lower electrode is used, the metal contamination amounts are also found to be reduced, as in the case of using the plasma etching apparatus configured to apply dual RF powers to the upper electrode and the lower electrode, respectively. That is, even when a self-bias voltage is not generated in the surface of the upper electrode 34, it is still possible to efficiently remove a deposit containing Hf which is a transition metal.

Experimental Examples 19 to 21

A semiconductor wafer W including a film containing a transition metal X, is plasma-processed. Then, there is performed a removing process in which a deposit containing the transition metal X and adhering to an upper electrode 34 is removed by using plasma of a processing gas G1 containing a $C_xF_y$ gas (x is an integer equal to or less than 2 and y is an integer equal to or less than 6) and, also, without containing a chlorine-based gas and a nitrogen-based gas while applying a negative DC voltage to the upper electrode 34. Processing conditions for the removing process are as follows.

Kind of plasma processing apparatus: a plasma etching apparatus configure to apply dual RF powers to an upper electrode and a lower electrode, respectively Pressure: 4.0 Pa (30 mT)

High frequency power (HF/LF): 500 W/250 W

DC voltage applied to upper electrode: −500 V

Temperature (upper/sidewall/lower): 60° C./60° C./20° C.

Time: 180 seconds

Processing gas and flow rate of processing gas: CF$_4$/CO/Ar=100 sccm/100 sccm/100 sccm Further, in the experimental examples 19 to 21, following metals are used as the transition metal X.

Experimental example 19: Ti (Titanium)

Experimental example 20: Hf (Hafnium)

Experimental example 21: Ta (Tantalum)

After the completion of the removing process in each experimental example, a metal contamination amount on the surface of the upper electrode 34 is measured. The metal contamination amount is an index indicating an adhesion amount of metal atoms per a unit area. In measuring the metal contamination amount, the metal contamination amount on the surface of the upper electrode 34 is not directly measured. That is, a Si substrate for testing is provided on the surface of the upper electrode 34, and a metal contamination amount on the surface of the Si substrate for testing is measured as the metal contamination amount on the surface of the upper electrode 34.

Experimental Examples 22 to 33

In experimental examples 22 to 33, unlike in the experimental examples 19 to 21, there is performed a removing process in which, while applying a negative DC voltage to an upper electrode 34, a deposit containing a transition metal X and adhering to the upper electrode 34 is removed by using plasma of a processing gas G3 containing a CH$_z$F$_w$ gas (z and w are integers equal to or less than 3) and, also, without containing a chlorine-based gas and a nitrogen-based gas. Processing conditions for the removing process are as follows.

Kind of plasma processing apparatus: a plasma etching apparatus configure to apply dual RF powers to an upper electrode and a lower electrode, respectively Pressure: 4.0 Pa (30 mT)

High frequency power (HF/LF): 500 W/250 W

Temperature (upper/sidewall/lower): 60° C./60° C./20° C.

Time: 180 seconds

Further, in the experimental examples 22 to 33, following metals are used as the transition metal X.

Experimental examples 22, 25, 28, 31: Ti (Titanium)

Experimental examples 23, 26, 29, 32: Hf (Hafnium)

Experimental examples 24, 27, 30, 33: Ta (Tantalum)

Further, in the experimental examples 22 to 33, following gases having flow rates as specified below are used as the processing gas G3.

Experimental examples 22 to 24 and 31 to 33: CHF$_3$/Ar/O$_2$=100 sccm/100 sccm/100 sccm Experimental examples 25 to 27: CHF$_3$/Ar/O$_2$=100 sccm/500 sccm/100 sccm Experimental examples 28 to 30: CHF$_3$/Ar/O$_2$=100 sccm/800 sccm/100 sccm Furthermore, in the experimental examples 22 to 33, DC voltages as specified below are applied to the upper electrode 34.

Experimental examples 22 to 30: −400 V

Experimental examples 31 to 33: −900 V

After the completion of the removing process in each experimental example, a metal contamination amount on the surface of the upper electrode 34 is measured. The metal contamination amount is an index indicating an adhesion amount of metal atoms per a unit area. In measuring the metal contamination amount, the metal contamination amount on the surface of the upper electrode 34 is not directly measured. That is, a Si substrate for testing is provided on the surface of the upper electrode 34, and a metal contamination amount on the surface of the Si substrate for testing is measured as the metal contamination amount on the surface of the upper electrode 34.

(Processing Results in Experimental Examples 19 to 33)

FIG. 10 is a diagram showing processing results in the experimental examples 19 to 33. A traced drawing 711 of FIG. 10 shows a surface state of a Si substrate for testing before performing the removing processes in the experimental examples 19, 22, 25, 28 and 31. A traced drawing 721 shows a surface state of the Si substrate for testing before performing the removing processes in the experimental examples 20, 23, 26, 29 and 32. Further, a traced drawing 731 shows a surface state of the Si substrate for testing before performing the removing processes in the experimental examples 21, 24, 27, 30 and 33. Further, traced drawings 712 to 716 show surface states of the Si substrates for testing after performing the removing processes in the experimental examples 19, 22, 25, 28 and 31, respectively. Traced drawings 722 to 726 show surface states of the Si substrates for testing after performing the removing processes in the experimental examples 20, 23, 26, 29 and 32, respectively. Further, traced drawings 732 to 736 show surface states of the Si substrates for testing after performing the removing processes in the experimental examples 21, 24, 27, 30 and 33, respectively. In each traced drawing, a metal contamination amount ($\times 10^{10}$ atms/cm$^2$) is also specified.

As can be seen from FIG. 10, in the removing processes of removing Ti, Hf or Ta as the transition metal, by applying the negative DC voltage to the upper electrode 34, the metal contamination amounts can be reduced regardless of the kind of the transition metal.

Further, as shown in FIG. 10, in the removing processes of removing Ti, the metal contamination amounts in the experimental examples 22, 25, 28 and 31 in which the processing gas G3 containing the $CH_zF_w$ gas and without containing the chlorine-based gas and the nitrogen-based gas is used are found to be reduced to the substantially same level as that of the experimental example 19 in which the processing gas G1 containing the $C_xF_y$ gas and without containing the chlorine-based gas and the nitrogen-based gas is used.

Moreover, as shown in FIG. 10, in the removing processes of removing Hf, the metal contamination amounts in the experimental examples 23, 26, 29 and 32 in which the processing gas G3 containing the $CH_zF_w$ gas and without containing the chlorine-based gas and the nitrogen-based gas is used are found to be reduced to the substantially same level as that of the experimental example 20 in which the processing gas G1 containing the $C_xF_y$ gas and without containing the chlorine-based gas and the nitrogen-based gas is used.

In addition, as can be seen from FIG. 10, in the removing processes of removing Ta, the metal contamination amounts in the experimental examples 24, 27, 30 and 33 in which the processing gas G3 containing the $CH_zF_w$ gas and without containing the chlorine-based gas and the nitrogen-based gas is used are found to be reduced to the substantially same level as that of the experimental example 21 in which the processing gas G1 containing the $C_xF_y$ gas and without containing the chlorine-based gas and the nitrogen-based gas is used.

Experimental Examples 34 and 35

A semiconductor wafer W including a film containing Al (aluminum), which is a base metal, is plasma-processed. Then, there is performed a removing process in which, while applying a negative DC voltage to an upper electrode 34, a deposit containing Al and adhering to the upper electrode 34 is removed by using plasma of a processing gas G3 containing a $CH_zF_w$ gas (z and w are integers equal to or less than 3) and, also, without containing a chlorine-based gas and a nitrogen-based gas. Processing conditions for the removing process are as follows.

Kind of plasma processing apparatus: a plasma etching apparatus configure to apply dual RF powers to a lower electrode
Pressure: 4.0 Pa (30 mT)
High frequency power (HF/LF): 1000 W/250 W
Temperature (upper/sidewall/lower): 60° C./60° C./20° C.
Time: 180 seconds Processing gas and flow rate of processing gas: $CHF_3$/Ar/$O_2$=100 sccm/100 sccm/100 sccm Further, in the experimental examples 34 and 35, DC voltages as specified below are applied to the upper electrode 34.

Experimental example 34: −150 V
Experimental example 35: −300 V

After the completion of the removing process in each experimental example, a metal contamination amount on the surface of the upper electrode 34 is measured. The metal contamination amount is an index indicating an adhesion amount of metal atoms per a unit area. In measuring the metal contamination amount, the metal contamination amount on the surface of the upper electrode 34 is not directly measured. That is, a Si substrate for testing is provided on the surface of the upper electrode 34, and a metal contamination amount on the surface of the Si substrate for testing is measured as the metal contamination amount on the surface of the upper electrode 34.

Comparative Example 15

In a comparative example 15, unlike in the experimental examples 34 and 35, a negative DC voltage is not applied to an upper electrode 34 in a removing process. The other processing conditions are the same as those in the experimental examples 34 and 35.

(Processing Results in Experimental Examples 34 and 34 and Comparative Example 15)

FIG. 11 is a diagram showing processing results in the experimental examples 34 and 35 and the comparative example 15. A traced drawing 741 of FIG. 11 shows a surface state of a Si substrate for testing before performing the removing processes in the experimental examples 34 and 35 and the comparative example 15. A traced drawing 742 shows a surface state of the Si substrate for testing after performing the removing processes in the comparative example 15. Further, traced drawings 743 and 744 show surface states of the Si substrates for testing after performing the removing processes in the experimental examples 34 and 35. In each traced drawing, a metal contamination amount ($\times 10^{10}$ atms/cm$^2$) is also specified.

As shown in FIG. 11, in the removing processes of removing Al, the metal contamination amounts are found to be reduced in the experimental examples 34 and 35 in which the negative DC voltage is applied to the upper electrode 34, as compared to that in case of the comparative example 15 in which a negative DC voltage is not applied to the upper electrode 34. That is, in the experimental examples 34 and 35, it is possible to efficiently remove a deposit containing Al, which is a base metal, as compared to the comparative example 15.

Experimental Examples 36 to 39

A semiconductor wafer W including a film containing Al, which is a base metal, is plasma-processed. Then, there is performed a removing process in which, while applying a negative DC voltage to an upper electrode 34, a deposit containing Al and adhering to the upper electrode 34 is removed by using plasma of a processing gas G1 containing a $C_xF_y$ gas (x is an integer equal to or less than 2 and y is an integer equal to or less than 6) and, also, without containing a chlorine-based gas and a nitrogen-based gas. Processing conditions for the removing process are as follows.

Kind of plasma processing apparatus: a plasma etching apparatus configured to apply a single RF power to a lower electrode and a negative DC voltage to an upper electrode Pressure: 4.0 Pa (30 mT)
High frequency power: 1 kW
Temperature (upper/sidewall/lower): 20° C./-/20° C.
Time: 180 seconds
Processing gas and flow rate of processing gas: $CF_4$=500 sccm Further, in the experimental examples 36 to 39, DC voltages as specified below are applied to the upper electrode 34.

Experimental example 36: −100 V
Experimental example 37: −150 V
Experimental example 38: −300 V
Experimental example 39: −500 V Experimental Examples 40 to 44

A semiconductor wafer W including a film containing Hf, which is a transition metal, is plasma-processed. Then, there is performed a removing process in which, while applying a negative DC voltage to an upper electrode 34, a deposit containing Hf and adhering to the upper electrode 34 is removed by using plasma of a processing gas G1 containing a $C_xF_y$ gas (x is an integer equal to or less than 2 and y is an integer equal to or less than 6) and, also, without containing a chlorine-based gas and a nitrogen-based gas. Processing conditions for the removing process are as follows.

Kind of plasma processing apparatus: a plasma etching apparatus configured to apply a single RF power to a lower electrode and a negative DC voltage to an upper electrode Pressure: 4.0 Pa (30 mT)
High frequency power: 1 kW
Temperature (upper/sidewall/lower): 20° C./-/20° C.
Time: 180 seconds
Processing gas and flow rate of processing gas: $CF_4$=500 sccm Further, in the experimental examples 40 to 44, DC voltages as specified below are applied to the upper electrode 34.

Experimental example 40: −50 V
Experimental example 41: −100 V
Experimental example 42: −150 V
Experimental example 43: −300 V
Experimental example 44: −500 V Experimental Example 45

In an experimental example 45, unlike in the experimental examples 40 to 44, a negative DC voltage is not applied to an upper electrode 34 in a removing process. The other processing conditions are the same as those in the experimental examples 40 to 44.

After the completion of the removing process in each experimental example, a metal contamination amount on the surface of the upper electrode 34 is measured. The metal contamination amount is an index indicating an adhesion amount of metal atoms per a unit area. In measuring the metal contamination amount, the metal contamination amount on the surface of the upper electrode 34 is not directly measured. That is, a Si substrate for testing is provided on the surface of the upper electrode 34, and a metal contamination amount on the surface of the Si substrate for testing is measured as the metal contamination amount on the surface of the upper electrode 34.

Comparative Example 16

In a comparative example 16, unlike in the experimental examples 36 to 39, a negative DC voltage is not applied to an upper electrode 34 in a removing process. The other processing conditions are the same as those in the experimental examples 36 to 39.

Comparative Example 17

In a comparative example 17, unlike in the experimental examples 36 to 39, a negative DC voltage of −50 V is applied to an upper electrode 34 in a removing process. The other processing conditions are the same as those in the experimental examples 36 to 39.

(Processing Results in Experimental Examples 36 to 45 and Comparative Examples 16 and 17)

Figure 12:
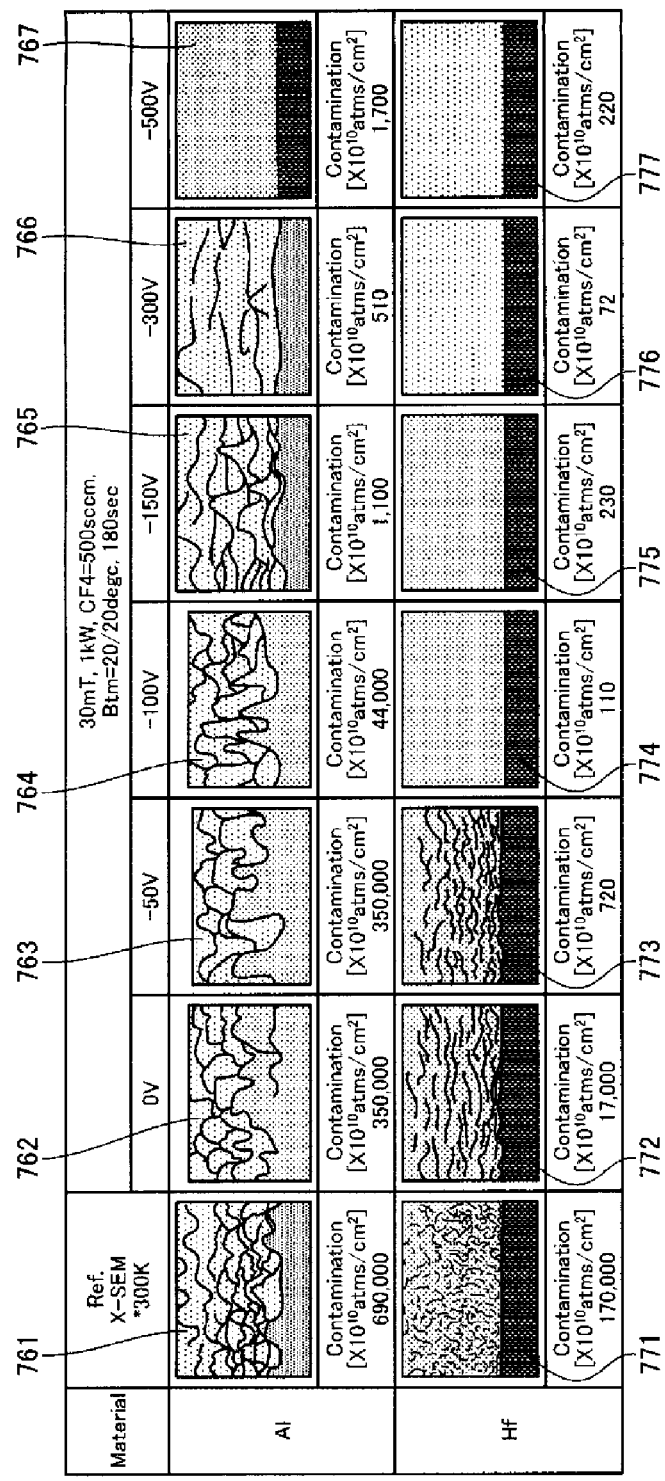
FIG. 12 is a diagram showing processing results in experimental examples 36 to 45 and comparative examples 16 and 17.

FIG. 12 is a diagram showing processing results in the experimental examples 36 to 45 and the comparative examples 16 and 17. A traced drawing 761 of FIG. 12 shows a surface state of a Si substrate for testing before performing the removing processes in the experimental examples 36 to 39 and the comparative examples 16 and 17. A traced drawing 771 shows a surface state of the Si substrate for testing before performing the removing processes in the experimental examples 40 to 45. Further, traced drawings 762 and 763 show surface states of the Si substrates for testing after performing the removing processes in the comparative examples 16 and 17, respectively. Traced drawings 764 to 767 show surface states of the Si substrates for testing after performing the removing processes in the experimental examples 36 to 39. Further, traced drawings 773 to 77 show surface states of the Si substrates for testing after performing the removing processes in the experimental examples 40 to 44, respectively. A traced drawing 772 shows a surface state of the Si substrate for testing after performing the removing process in the experimental example 45. In each traced drawing, a metal contamination amount ($\times 10^{10}$ atms/cm$^2$) is also specified.

As shown in FIG. 12, in the removing processes of removing Al, the metal contamination amounts are found to be reduced in the experimental examples 36 to 39 in which the negative DC voltage equal to or less than −100 V is applied to the upper electrode 34, as compared to the comparative example 16 in which a negative DC voltage is not applied to the upper electrode 34 and in the comparative example 17 in which the negative DC voltage higher than −100 V is applied to the upper electrode 34. That is, it is found out that the deposit containing Al as a base metal can be removed efficiently by setting the negative DC voltage to be applied to the upper electrode 34 to be equal to or less than −100 V.

Further, as depicted in FIG. 12, in the removing processes of removing Hf, the metal contamination amounts are found to be reduced, regardless of whether or not the negative DC voltage is applied to the upper electrode 34.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

We claim:

1. A plasma processing method comprising:
loading a processing target object including a film including at least one of a transition metal and a base metal into a processing vessel;
etching the processing target object by plasma of a first processing gas so that at least one of the transition metal and the base metal is dispersed from the processing target object and so that a deposit including at least one of the transition metal and the base metal adheres to a member within the processing vessel;
unloading the processing target object from the processing vessel; and
without loading a substrate, removing the deposit, which adheres to the member within the processing vessel and includes at least one of the transition metal and the base metal, by plasma of a second processing gas, wherein the second processing gas includes a CO gas, Ar gas and a $C_xF_y$ gas, in which x is an integer equal to or less than 2 and y is an integer equal to or less than 6, and does not include a chlorine-based gas and a nitrogen-based gas,
wherein the deposit is removed by the plasma of the second processing gas while applying a negative DC voltage to the member within the processing vessel, and
wherein the negative DC voltage is set to be equal to or less than −100V such that argon ions in the plasma of the second processing gas collide with the member within the processing vessel and the deposit is removed by sputtering of the argon ions.

2. The plasma processing method of claim 1, wherein the second processing gas is at least one of a $CF_4$/CO/Ar gas, and a $C_2F_6$/CO/Ar gas.

3. The plasma processing method of claim 1, wherein the transition metal is at least one of Ti, Hf and Ta.

4. The plasma processing method of claim 1, wherein the base metal is Al.

5. The plasma processing method of claim 1, wherein the plasma of the second processing gas is generated by applying powers to two facing electrodes within the processing vessel, respectively, and the deposit is removed by the generated plasma.

* * * * *